(12) United States Patent
Borden et al.

(10) Patent No.: US 7,436,087 B2
(45) Date of Patent: Oct. 14, 2008

(54) POWER LINE CONDITIONER

(75) Inventors: Scott M. Borden, Rochester, NY (US);
Randy J. King, Rochester, NY (US);
Ronald C. Moffatt, Rochester, NY (US)

(73) Assignee: Belkin International, Inc., Compton, CA (US)

( * ) Notice: Subject to any disclaimer, the term of this patent is extended or adjusted under 35 U.S.C. 154(b) by 0 days.

(21) Appl. No.: 11/801,028

(22) Filed: May 7, 2007

(65) Prior Publication Data

US 2007/0267919 A1 Nov. 22, 2007

Related U.S. Application Data

(63) Continuation of application No. 10/752,854, filed on Jan. 1, 2004, now Pat. No. 7,233,086.

(51) Int. Cl.
*H01B 7/30* (2006.01)

(52) U.S. Cl. .......................... 307/147; 307/80

(58) Field of Classification Search ............... 307/80, 307/147
See application file for complete search history.

(56) References Cited

U.S. PATENT DOCUMENTS

| | | | |
|---|---|---|---|
| 4,092,591 A | 5/1978 | Lozowski | |
| 4,807,803 A | 2/1989 | Yang | |
| 4,875,152 A | 10/1989 | Foster | |
| 4,912,590 A | 3/1990 | Misencik et al. | |
| 5,115,368 A | 5/1992 | Smith | |
| 5,278,771 A | 1/1994 | Nyenya | |
| 5,339,017 A | 8/1994 | Yang | |
| 5,365,395 A | 11/1994 | Callaway | |
| 5,448,443 A | 9/1995 | Muelleman | |
| 5,583,413 A | 12/1996 | Proctor et al. | |
| 5,589,718 A | 12/1996 | Lee | |
| D382,855 S | 8/1997 | Salmond et al. | |
| 5,691,872 A | 11/1997 | Cohen | |
| 5,734,542 A | 3/1998 | Cohen | |
| 5,768,081 A | 6/1998 | Cohen et al. | |
| 6,054,849 A | 4/2000 | Collier et al. | |
| 6,283,787 B1 | 9/2001 | Chou | |
| 6,315,604 B1 | 11/2001 | Lee | |
| 6,323,652 B1 | 11/2001 | Collier et al. | |
| 6,411,482 B1 | 6/2002 | Funke | |
| 6,456,091 B1 | 9/2002 | Lee et al. | |

(Continued)

OTHER PUBLICATIONS

Max® 5510ACRegenerator®; http://www.panamax.com/products/ProductPage.asp?sName=M5510; retrieved from the internet on Jun. 13, 2003; 3 pages.

(Continued)

*Primary Examiner*—Robert L. Deberadinis
(74) *Attorney, Agent, or Firm*—Bryan Cave LLP

(57) ABSTRACT

An electrical power conditioning apparatus in accordance with the present invention generally includes an electrical input for receiving power from the power source, a surge suppression circuit and a plurality of electrical outlets. A plurality of parallel channels connect the input to at least one of the plurality of outlets. At least one of the plurality of channels includes a filter circuit and a current sensor circuit for measuring the current through the channel. One or more displays are electrically connected to the current measuring to a visual indication of voltage and current measurements.

20 Claims, 6 Drawing Sheets

U.S. PATENT DOCUMENTS

| | | |
|---|---|---|
| 6,605,882 B2 | 8/2003 | Boudrias |
| 6,624,997 B1 | 9/2003 | Llanos et al. |
| 7,233,086 B2 * | 6/2007 | Borden et al. ............... 307/147 |
| 2002/0126433 A1 | 9/2002 | Hoopes |

OTHER PUBLICATIONS

Max® 5100;http://www.panamax.com/products/ProductPage.asp?sName=M5100; retrieved from the internet on Jun. 13, 2003; 5 pages.

Max® 5300;http://www.panamax.com/products/ProductPage.asp?sName=M5300;retrieved from the internet on Jun. 13, 2003; 3 pages.

Max® 5500ACRegenerator®;http://www.panamax.com/products/ProductPage.asp?sName=M5500;retrieved from the internet on Jun. 13, 2003; 3 pages.

Max® 4310;http://www.panamax.com/products/ProductPage.asp?sName=M4310;retrieved from the internet on Jun. 13, 2003; 4 pages.

Max® 5500 ACRegenerator®; Silver Bezel Max® 5500;http://www.panamax.com/searchresults.asp;retrieved from the internet on Jun. 13, 2003; 1 page.

Max® 5300; Silver Bezel—Max® 5300;http://www.panamax.com/searchresults.asp; retrieved from the internet on Jun. 13, 2003; 1 page.

Max® 5100;http://www.panamax.com/searchresults.asp; retrieved from the internet on June 13, 2003; 1 page.

Max® 5510 ACRegenerator; http://www.panamax.com/searchresults.asp; retrieved from the internet on Jun. 13, 2003; 1 page.

PowerBrite Pro, PowerBrite, PowerStrip Owners Manual; Samson Technologies Corp.; Mar. 1998; 16 pages.

Monster Cable; Home Theatre Reference PowerCenter™ HTS 5100 with Clean Power™ 4 v2.0; http://www.monstercable.com/productPage.asp?pin=1316; retrieved from the internet on Jan. 6, 2004; 8 pages.

* cited by examiner

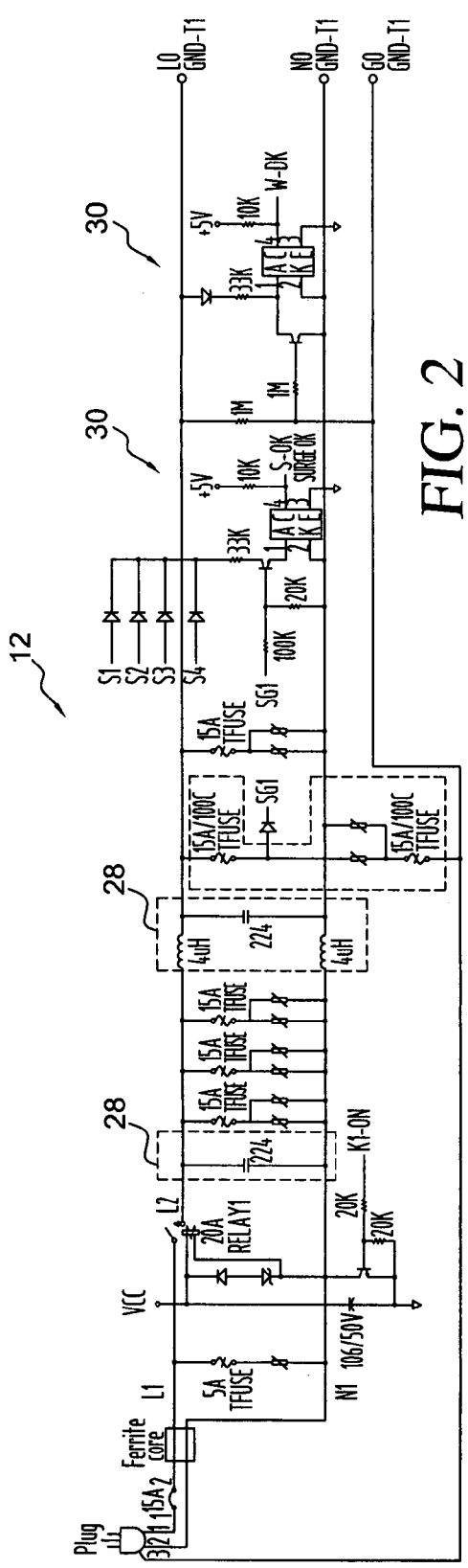
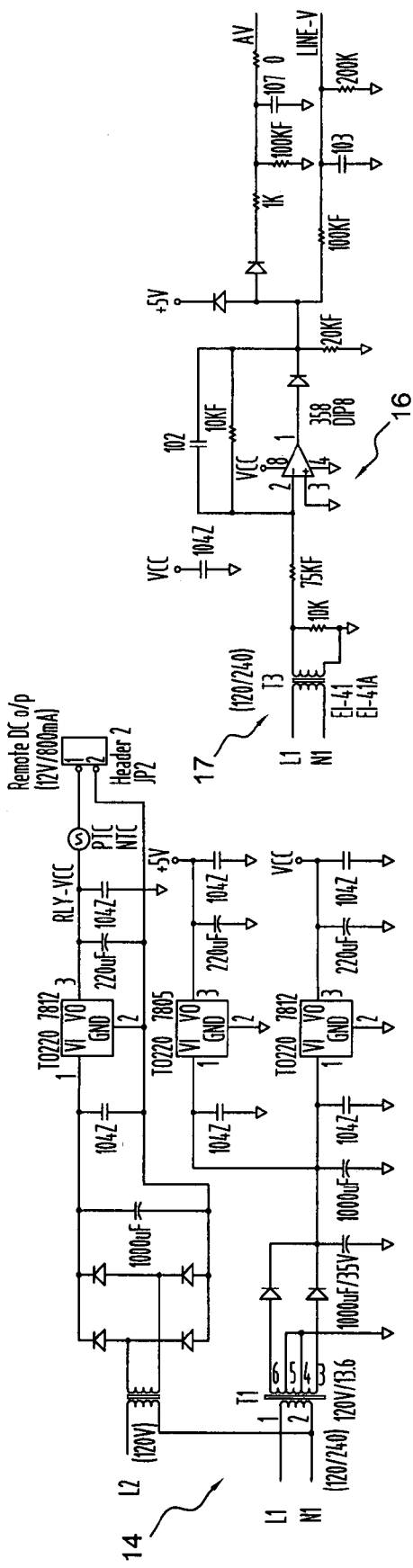
FIG. 2
FIG. 3
FIG. 4

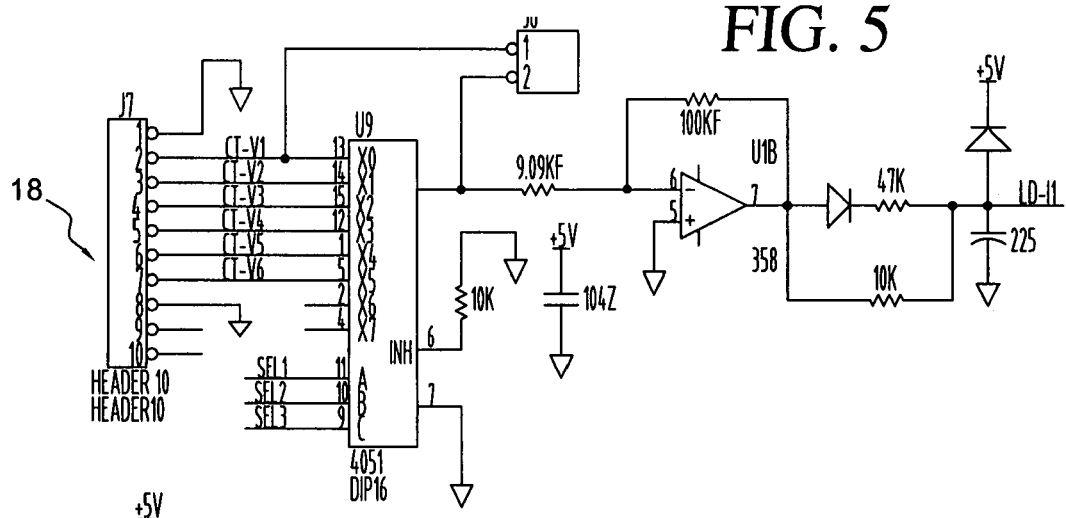
FIG. 5
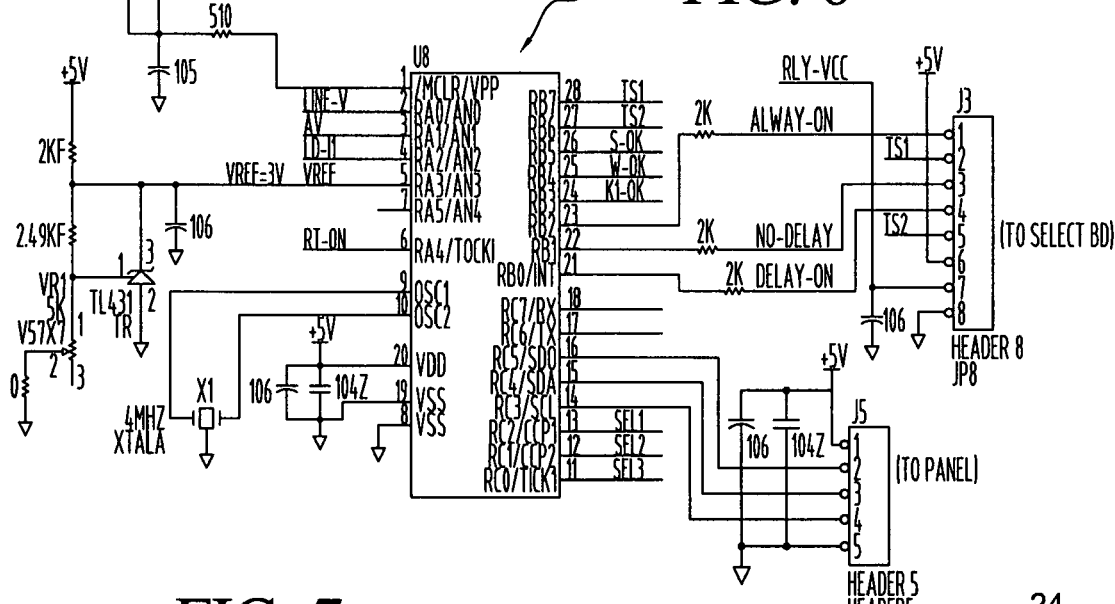
FIG. 6
FIG. 7
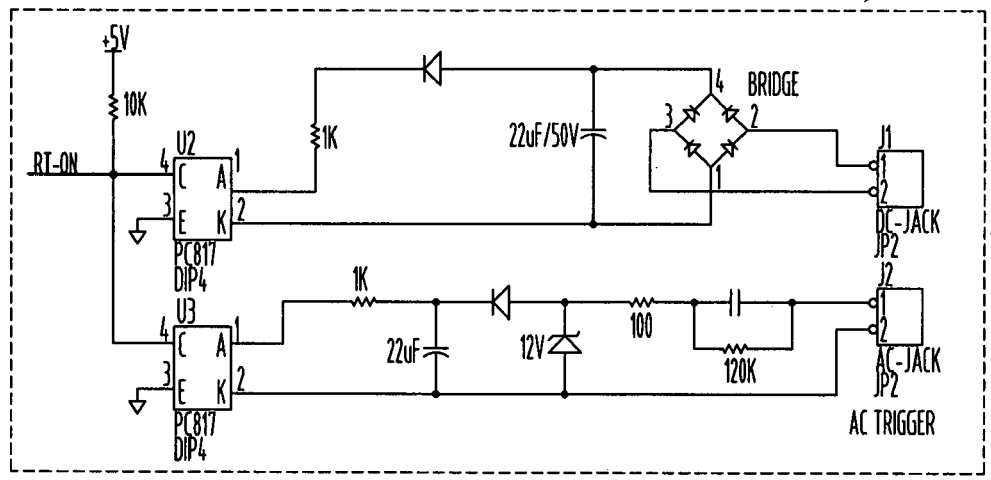

POWER LINE CONDITIONER

CROSS REFERENCE TO RELATED APPLICATIONS

This application is a continuation application of U.S. patent application Ser. No. 10/752,854, filed Jan. 1, 2004 now U.S. Pat. No. 7,233,086. Furthermore, U.S. patent application Ser. No. 10/752,854 is incorporated herein by reference.

FIELD OF THE INVENTION

The invention relates to the field of power line devices for electrical power distribution, and more specifically, to a multi-outlet power line conditioner that allows several electrically powered devices to be coupled to a single outlet and provides surge protection, filtering and visual voltage and current indications.

BACKGROUND

Multi-outlet power conditioners provide high purity electrical power to multiple electronic devices powered using a single wall outlet. Such devices often contain surge protection circuits for protecting consumer electronics, such as computers, televisions and other audio/visual equipment, from damage resulting from random power surges and voltage spikes. Power conditioners also typically contain filtering elements for reducing AC power line noise.

One shortcoming of conventional power conditioners is that they generally do not provide a visual indication of power conditions so that the user can determine if the electronic devices are receiving power at optimal voltage and current conditions. One attempt to overcome this problem is described in Lee et al., U.S. Pat. No. 6,456,091. Lee generally describes a power line conditioner having LED indicators for showing input current received by the power line conditioner from the wall outlet.

However, power conditioners are typically used to power multiple electrical devices, such as, separate audio, visual or computer devices, having different power requirements. While Lee generally describes a means for detecting and displaying input current from the wall outlet, it fails to provide an effective means for monitoring and displaying the voltage and current delivered to the separate outlets for each electrical device. Furthermore, Lee does not provide a means for measuring electrical current conditions after transmission through the circuitry of the power conditioner. It would therefore be highly desirable to provide a power conditioner having the capability of monitoring and displaying voltage and current actually received by the separate electronic devices.

The present invention provides these and other advantages over conventional power line conditioners.

SUMMARY

An electrical power conditioning apparatus in accordance with the present invention generally includes an electrical input for receiving power from the power source, a surge suppression circuit and a plurality of electrical outlets. A plurality of parallel channels connect the input to at least one of the plurality of outlets. At least one of the plurality of channels includes a filter circuit and a current sensor circuit for measuring the current through the channel. One or more displays are electrically connected to the current measuring circuits to provide a visual indication of voltage and current measurements.

DRAWINGS

These and other features, aspects and advantages of the present invention will become more fully apparent from the following detailed description, appended claims, and accompanying drawings where:

FIG. 2 is a schematic of an embodiment of a surge suppression circuit;

FIG. 3 is a schematic of an embodiment of an internal power supply;

FIG. 4 is a schematic of an embodiment of a voltage signal conditioner;

FIG. 5 is a schematic of an embodiment of a current signal conditioner;

FIG. 6 is a schematic of an embodiment of a system controller;

FIG. 7 is a schematic of an embodiment of a remote control;

Figure 1:
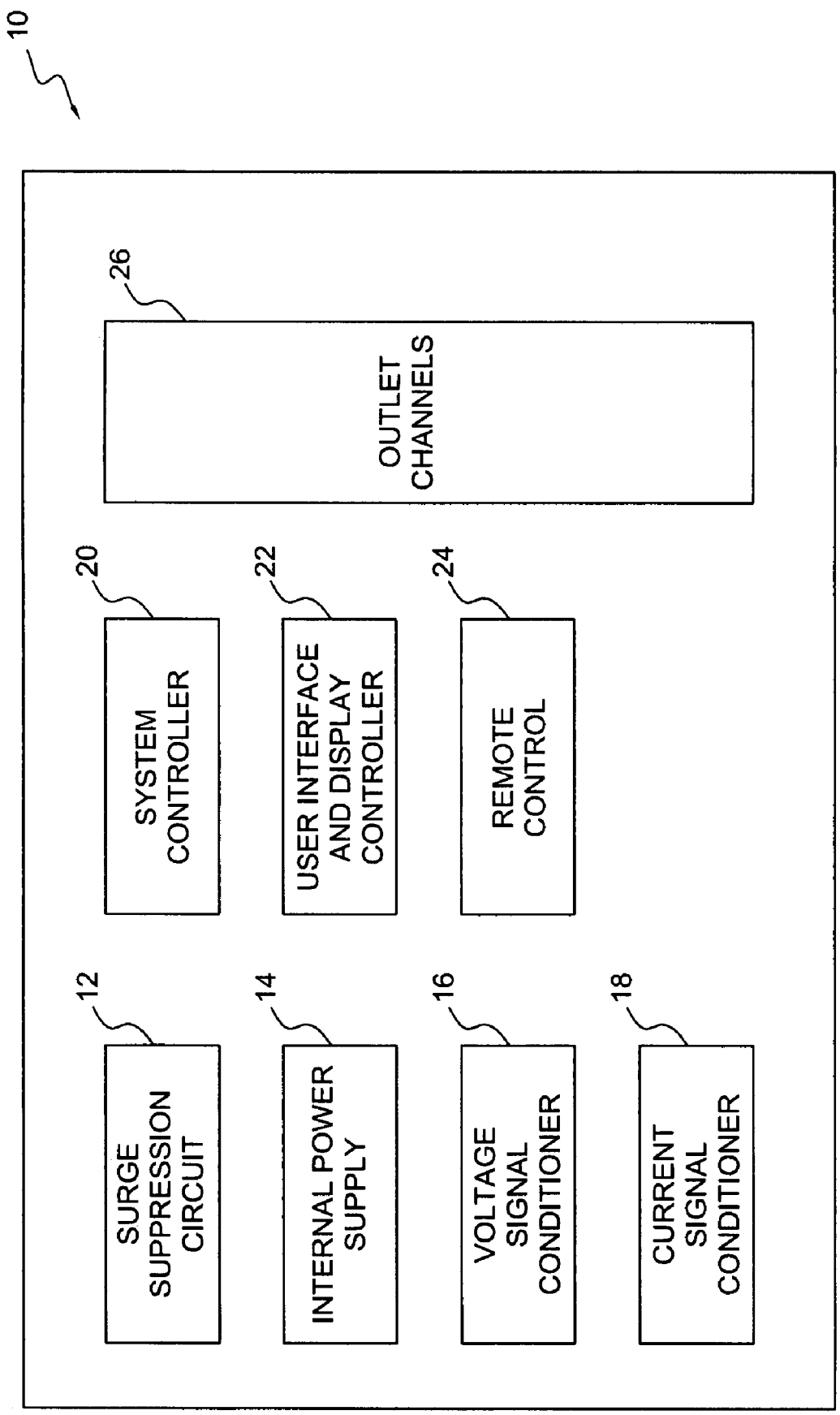
FIG. 1 is a block diagram of an embodiment of a power conditioner apparatus in accordance with the present invention.

For simplicity and clarity of illustration, the drawing figures illustrate the general elements of the apparatus. Description and details of well-known features and techniques are omitted to avoid unnecessarily obscuring the invention.

DESCRIPTION OF PREFERRED EMBODIMENTS

An electrical power conditioning apparatus in accordance with the present invention comprises an electrical input for receiving power from the power source, a surge suppression circuit, a plurality of electrical outlets and plurality of parallel channels connecting the input to one or more of the outlets. One or more of the plurality of channels includes a filter circuit and a current sensor circuit for measuring the current through each channel. A display is electrically connected to the current measuring circuit to provide a visual indication of current measurements.

Referring to FIG. 1, a preferred embodiment of the power line conditioner apparatus 10 comprises the following main components: surge suppression circuit 12, internal power supply 14, voltage signal conditioner 16, current signal conditioner 18, system controller 20, user interface and display controller 22, remote control 24, and outlet channels 26. The apparatus 10 may be electrically coupled to receive power from a standard wall outlet via a plug and/or cord or, alternatively, may be directly connected to a source of power without a plug and/or cord.

FIG. 2 illustrates an embodiment of a surge suppression circuit 12. In the illustrated example, the surge suppression circuit is electrically coupled to an electrical power source via an electrical input, such as a plug 13. The surge suppression circuit 12 can include one or more filters 28, which are preferably configured to filter higher frequency noise. The surge suppression circuit 12 can also include various monitoring circuits 30 for monitoring the condition of the surge suppression circuits. These monitoring circuits may provide output as shown indicating whether there has been a failure in the surge protection circuit or whether the source of power is operationally useful (e.g., whether a proper ground exists or whether the hot and neutral conditions are proper). Various other surge protection devices known in the art can be also be used.

FIG. 3 illustrates an embodiment of an internal power supply circuit 14 for generating voltages required for various internal components of the apparatus. Various other internal power supply devices known in the art can be also be used.

FIG. 4 illustrates an embodiment of a voltage signal conditioner 16. Voltage signal conditioner 16 is electrically connected to one or more voltage sensor circuits 17. The voltage signal conditioner 16 receives an AC signal from one or more voltage sensor circuits 17 and converts the signal to a proportional DC signal, which is transmitted to the system controller 20 (FIG. 6).

FIG. 5 illustrates an embodiment of a current signal conditioner 18. The current signal conditioner 18 is electrically connected to a plurality of current sensor circuits 44 (shown in FIG. 9). Current signal conditioner 18 receives an AC signal from the current sensor 44 and converts the signal to a proportional DC signal, which is transmitted to the system controller 20 (FIG. 6).

Figure 8:
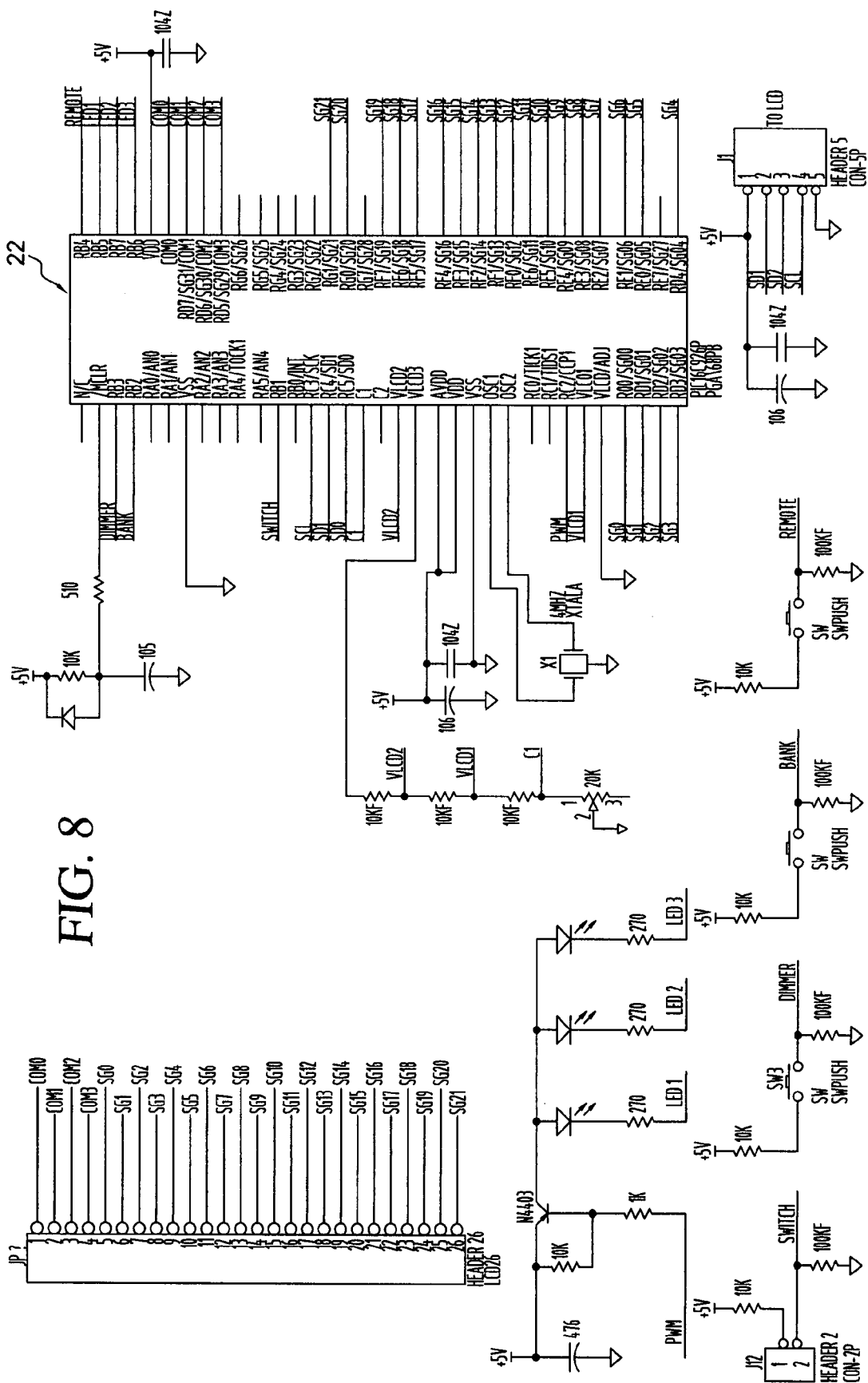
FIG. 8 is a schematic of an embodiment of a user interface and display controller.

FIG. 6 illustrates an embodiment of a system controller 20. A function of the system controller is to receive DC signals from the voltage signal conditioner 16 and current signal conditioner 18, process those signals, and transmit control signals to the user interface and display control 22 (FIG. 8). The system controller 20 also includes a processor and associated circuitry for controlling the overall operation of the apparatus.

FIG. 7 illustrates an embodiment of a remote control circuit 24. Functions of the remote control 24 include permitting the apparatus to receive external signals from other devices to turn the apparatus on and off.

FIG. 8 illustrates an embodiment of a user interface and display controller 22. The display provides a visual indication of current and voltage measurements and other indications.

Figure 9:
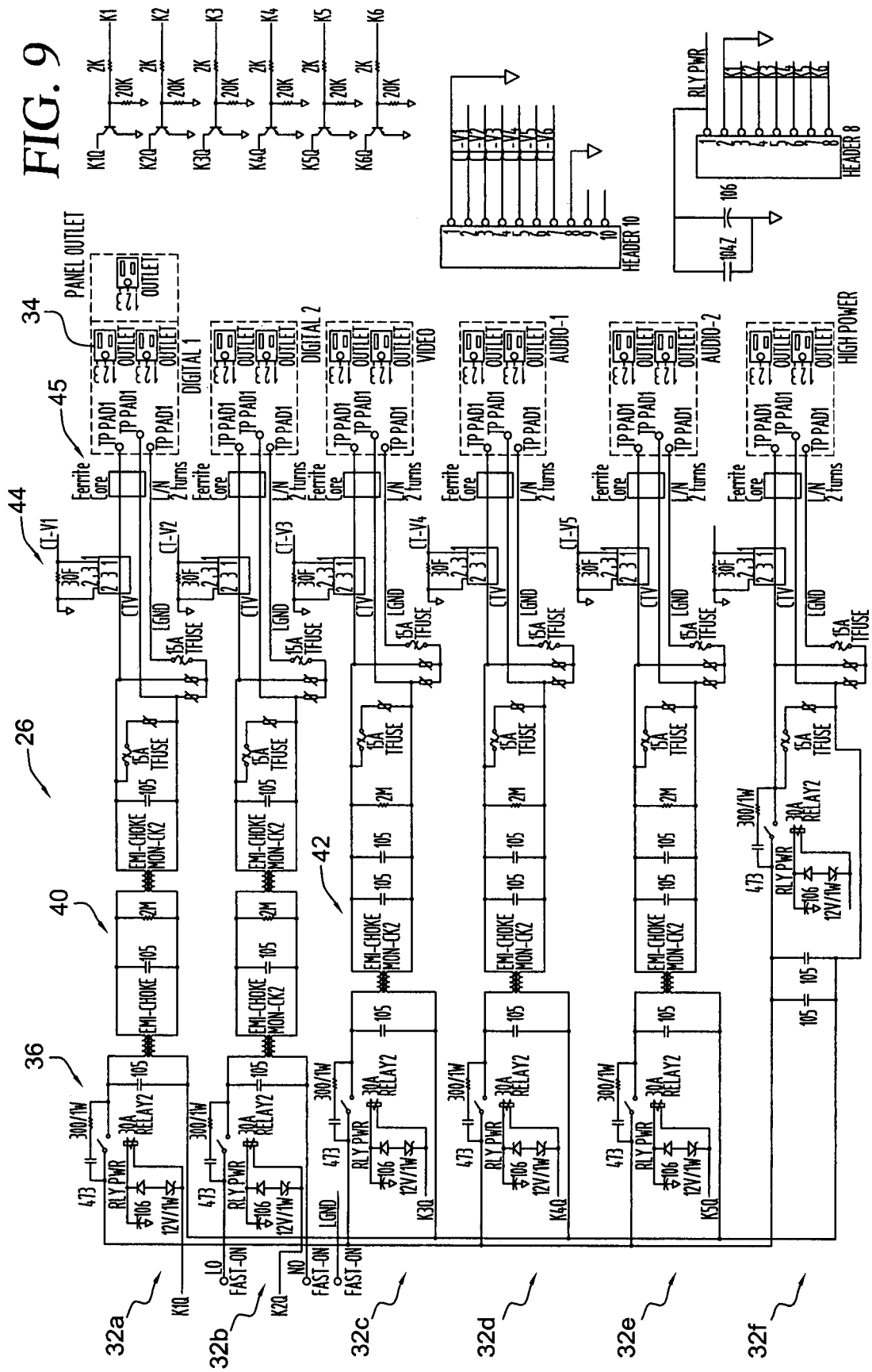
FIG. 9 is a schematic of an embodiment of outlet channels.

FIG. 9 illustrates an embodiment of circuitry for the outlet channels 26, which includes a plurality of parallel channels 32a, 32b, 32c, 32d, 32e and 32f. Each channel transmits electrical power to one or more electrical outlets 34. Each channel can include a power relay or switch 36 for independently turning the channel on and off. One or more channels can include filter circuits of various configurations. For example, the illustrated embodiment channels 32a and 32b have a two-stage filter 40, whereas channels 32c and 32d have a single stage filter configuration 42. The apparatus can also include one or more unfiltered channels. Such channels may be preferable for use for high power devices, such as stereo amplifiers. The illustrated embodiment includes one such unfiltered channel 32f. Each channel can also include an EMI suppression circuit 45 for suppressing high frequency noise transmitted to or from the outlets (e.g., from electrical devices plugged into the apparatus). The EMI suppression circuit can comprise, for example, a Ferrite core device.

One or more of the channels includes a current sensing circuit 44 for sensing the current through the channel. In the illustrated embodiment, each channel 32a-32f includes a current sensing circuit 44. The current sensing circuit can be located anywhere on the outlet channel, but is preferably located at the output of the filter (e.g., filters 40 and 42) close to the electrical outlets 34. Such positioning allows the current sensing circuit to accurately measure current delivered to the outlets 34 and not include current losses in the filter circuit and other control circuits of the apparatus. Thus, the apparatus provides an accurate measurement of the current of each separate channel as actually delivered to the electrical devices powered through the power conditioning apparatus.

Figure 10:
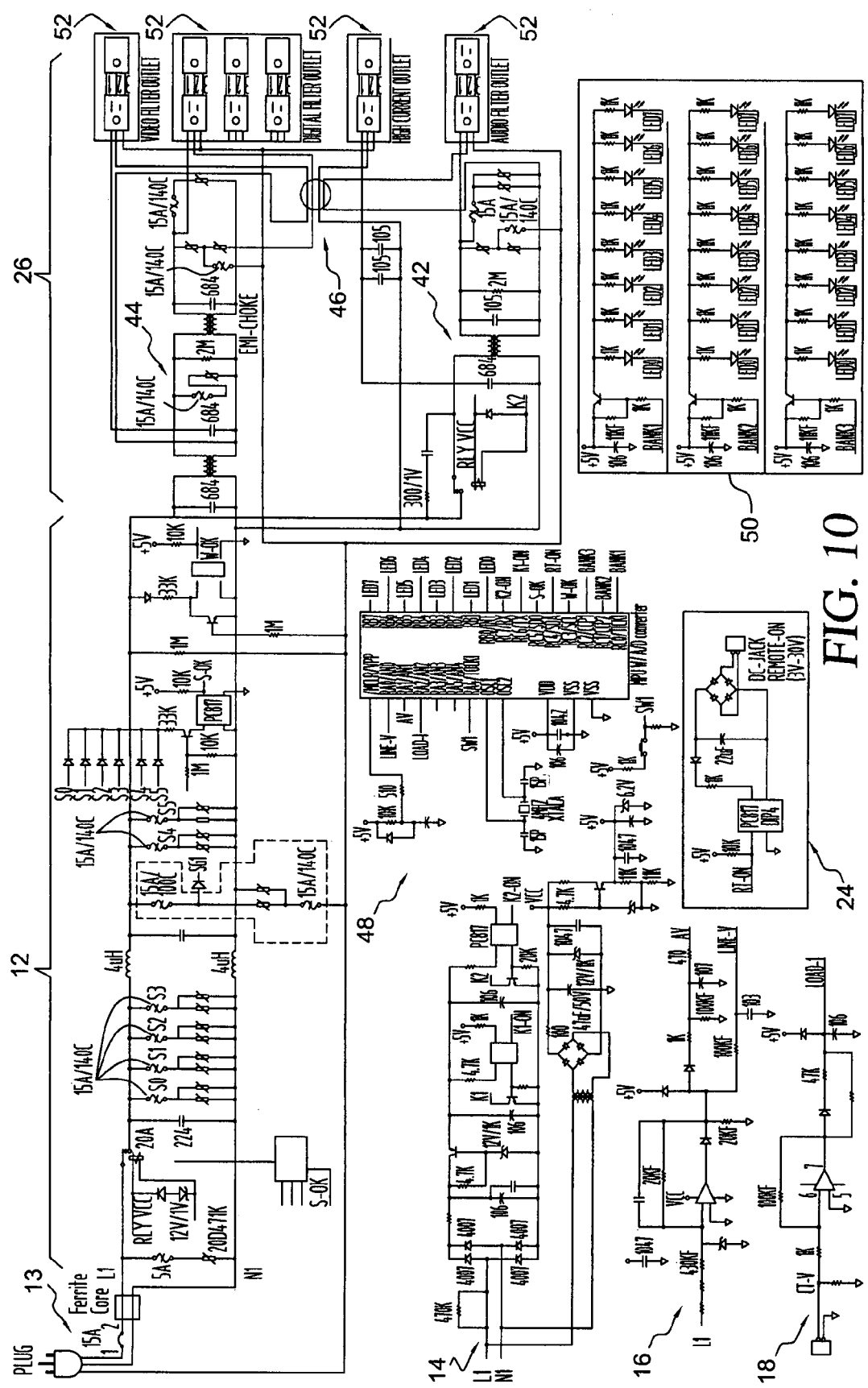
FIG. 10 is a schematic of an embodiment of a power conditioner apparatus of the present invention having a single current sensing circuit.

FIG. 10 illustrates an example of an alternative embodiment of the power conditioning apparatus having a single current sensing circuit 46 for measuring the sum of the current through the plurality of channels. In the illustrated embodiment, the power conditioning apparatus generally includes surge suppression circuitry 12, internal power supply 14, voltage signal conditioner 16, current signal conditioner 18, and remote control 24, which have a similar structure and function to the corresponding elements of the multiple current sensing embodiment described above. The illustrated embodiment of the apparatus has a controller 48, which receives DC signals from the voltage signal conditioner 16 and current signal conditioner 18, processes those signals and transmits control signals to the voltage and current status indicators 50.

The apparatus includes a plurality parallel outlet channels 52a, 52b, 52c, and 52d. The embodiment illustrated in FIG. 10 differs most significantly from the embodiment illustrated in FIGS. 2-9 in that the current sensing device 46 is configured to detect the sum of the current through each of the plurality of parallel channels 52a, 52b, 52c and 52d, and transmit an AC signal to current conditioner 18. As in the embodiment illustrated above, the version of the apparatus illustrated in FIG. 10 includes a two-stage filter structure 44 on channel 52b and a single stage filter structure 42 on channel 52d.

Although the invention has been described with reference to specific embodiments, it should be understood that various changes may be made without departing from the spirit or scope of the invention. Accordingly, the disclosed examples are intended to be illustrative of the scope of the invention and are not intended to be limiting. The scope of the invention is defined as set forth in the appended claims.

What is claimed is:

1. An electrical power conditioning device comprising:
    an input configured to receive electrical power from a power source;
    a surge suppression circuit;
    at least two electrical outlets,
    one or more first channels, each of the one or more first channels is configured to electrically couple the input to at least a first outlet of the at least two electrical outlets;
    each channel of the one or more first channels comprising:
        a one-stage filter; and
        a current sensor circuit configured to measure the current through the first channel;
    one or more second channels, each of the one or more second channels is configured to electrically couple the input to at least a second outlet of the at least two electrical outlets;
    each channel of the one or more second channels comprising:
        a two-stage filter; and
        a current sensor circuit configured to measure the current through the second channel; and
    one or more displays electrically coupled to the current sensor circuits of the one or more first channels and the one or more second channels, and configured to provide at least one visual indication of current measurements from the current sensor circuits of the one or more first channels and the one or more second channels.

2. The device of claim 1, wherein:
the one or more displays are configured to provide a first visual indication of the current measured by the current sensor circuit in one channels of the one or more first channels; and
the at least one visual indication comprises the first visual indication.

3. The device of claim 2, wherein:
the one or more displays are further configured to provide a second visual indication of the current measured by the current sensor circuit in one channels of the one or more second channels; and
the at least one visual indication further comprises the second visual indication.

4. The device of claim 1, wherein:
the at least one visual indication illustrates the sum of the currents through the one or more first channels and the one or more second channels.

5. The device of claim 1, wherein:
the current sensing circuit in each channel of the one or more second channels is located at an input of that channel.

6. The device of claim 1, wherein:
the current sensing circuit in each channel of the one or more first channels is located at an input of that channel.

7. The device of claim 6, wherein:
the current sensing circuit in each channel of the one or more second channels is located at an input of that channel.

8. The device of claim 1, further comprising:
one or more voltage measuring circuits electrically coupled to the one or more displays, wherein:
the one or more displays are configured to provide a visual indication of voltage measurements by the one or more voltage measuring circuits.

9. The device of claim 1, wherein:
each of the one or more first channels further comprises: an EMI suppression circuit; and
each of the one or more second channels further comprises: an EMI suppression circuit.

10. The device of claim 1, further comprising:
one or more third channels, each of the one or more third channels is configured to electrically couple the input to at least a third outlet of the two or more electrical outlets; and
each of the one or more third channels comprising:
a current sensor circuit configured to measure the current through the third channel,
wherein:
each channel of the one or more third channels are devoid of a two-stage filter and a one-stage filter.

11. The device of claim 10, wherein:
the one or more displays are electrically coupled to the current sensor circuits of the one or more third channels; and
the one or more displays are further configured to provide a first visual indication of the current measured by the current sensor circuit in at least one channel of the one or more third channels.

12. The device of claim 10, wherein:
the at least one visual indication illustrates the sum of the currents through the one or more first channels, the one or more second channels, and the one or more third channels.

13. An electrical power conditioning device comprising:
an input configured to receive electrical power from a power source;
a surge suppression circuit;
at least two electrical outlets;
one or more first channels, each of the one or more first channels is configured to electrically couple the input to at least a first outlet of the at least two electrical outlets;
each channel of the one or more first channels comprising:
a two-stage filter; and
a current sensor circuit configured to measure the current through the first channel;
one or more second channels, each of the one or more second channels is configured to electrically couple the input to at least a second outlet of the at least two electrical outlets;
each channel of the one or more second channels comprising:
a current sensor circuit configured to measure the current through the second channel; and
one or more displays electrically coupled to the current sensor circuits of the one or more first channels and the one or more second channels, and configured to provide at least one visual indication of current measurements from the current sensor circuits of the one or more first channels and the one or more second channels,
wherein:
each channel of the one or more second channels are devoid of a two-stage filter and a one-stage filter.

14. The device of claim 13, wherein:
the current sensing circuit in each channel of the one or more first channels is located at an input of that channel.

15. The device of claim 13, wherein:
the at least one visual indication illustrates the sum of the currents through the one or more first channels and the one or more second channels.

16. The device of claim 13, wherein:
the one or more displays are configured to provide a first visual indication of the current measured by the current sensor circuit in one channels of the one or more first channels; and
the one or more displays are further configured to provide a second visual indication of the current measured by the current sensor circuit in one channels of the one or more second channels; and
the at least one visual indication comprises the first visual indication and second visual indication.

17. An electrical power conditioning device comprising:
an input configured to receive electrical power from a power source;
a surge suppression circuit;
at least two electrical outlets;
one or more first channels, each of the one or more first channels is configured to electrically couple the input to at least a first outlet of the at least two electrical outlets;
each channel of the one or more first channels comprising:
a one-stage filter; and
a current sensor circuit configured to measure the current through the first channel;
one or more second channels, each of the one or more second channels is configured to electrically couple the input to at least a second outlet of the at least two electrical outlets;
each channel of the one or more second channels comprising:
a current sensor circuit configured to measure the current through the second channel; and
one or more displays electrically coupled to the current sensor circuits of the one or more first channels and the one or more second channels, and configured to provide at least one visual indication of current measurements from the current sensor circuits of the one or more first channels and the one or more second channels,
wherein:
each of the one or more second channels are devoid of a two-stage filter and a one-stage filter.

18. The device of claim 17, wherein:
the current sensing circuit in each channel of the one or more first channels is located at an input of that channel.

19. The device of claim 17, wherein:
the at least one visual indication illustrates the sum of the currents through the one or more first channels and the one or more second channels.

20. The device of claim 17, wherein:
the one or more displays are configured to provide a first visual indication of the current measured by the current sensor circuit in one channels of the one or more first channels; and
the one or more displays are further configured to provide a second visual indication of the current measured by the current sensor circuit in one channels of the one or more second channels; and
the at least one visual indication comprises the first visual indication and second visual indication.

* * * * *